(12) United States Patent
Li

(10) Patent No.: US 11,316,035 B2
(45) Date of Patent: Apr. 26, 2022

(54) SOURCE AND DRAIN EPITAXY FORMING METHOD CAPABLE OF IMPROVING PERFORMANCE OF FINFET DEVICE

(71) Applicant: SHANGHAI HUALI INTEGRATED CIRCUIT CORPORATION, Shanghai (CN)

(72) Inventor: Yong Li, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 17/026,075

(22) Filed: Sep. 18, 2020

(65) Prior Publication Data

US 2022/0029003 A1 Jan. 27, 2022

(30) Foreign Application Priority Data

Jul. 27, 2020 (CN) .......................... 202010729638.4

(51) Int. Cl.
*H01L 29/66* (2006.01)
*H01L 21/8234* (2006.01)

(52) U.S. Cl.
CPC .............. *H01L 29/66818* (2013.01); *H01L 21/823418* (2013.01); *H01L 21/823431* (2013.01); *H01L 21/823481* (2013.01)

(58) Field of Classification Search
CPC ....... H01L 29/66818; H01L 21/823418; H01L 21/823431; H01L 21/823481
See application file for complete search history.

(56) References Cited

U.S. PATENT DOCUMENTS

| | | | |
|---|---|---|---|
| 2014/0175512 A1* | 6/2014 | Chu-Kung | ............ H01L 29/785 257/190 |
| 2020/0027981 A1* | 1/2020 | Park | .................... H01L 29/0649 |
| 2020/0083090 A1* | 3/2020 | Chan | .................... H01L 21/0332 |
| 2021/0265350 A1* | 8/2021 | Chin | .................... H01L 29/7851 |

* cited by examiner

*Primary Examiner* — Christine A Enad
(74) *Attorney, Agent, or Firm* — Alston & Bird LLP

(57) ABSTRACT

A method making a fin device structure includes: forming a plurality of fin structures arranged spaced out from each other in a longitudinal direction and covered with a thin oxide layer; forming a plurality of gate structures in a transverse direction; depositing sidewalls covering the thin oxide layer of the gate structures and the fin structures; removing the sidewalls on the gate structures and the sidewalls of the fin structures; removing the thin oxide layer on the sidewalls of the trenches to expand the volume of each trench; forming an epitaxial layer structure at the trenches; the method further includes removing the oxides on the sidewalls to increase the volume of the subsequently grown epitaxial layer, such that it is conducive to increasing the stress and reducing the source and drain resistance, thus improving the performance of the device.

9 Claims, 4 Drawing Sheets step 1: providing a fin device structure, including:

forming a plurality of fin structures located on a substrate and arranged in a spaced manner in a longitudinal direction; wherein outer surfaces of the plurality of fin structures and the substrate are covered with a thin oxide layer;

forming shallow trench isolation (STI) regions located between adjacent ones of the plurality of fin structures outside the thin oxide layer , wherein upper surfaces of the STI regions are lower than a top of the plurality of fin structures; wherein each of the plurality of fin structures comprises a first fin structure, wherein the first fin structure is higher than an upper surface of the STI regions ; and forming a plurality of gate structures on the substrate and arranged spaced out from each other in a transverse direction on the thin oxide layer on the outer surfaces of the plurality of fin structures;

step 2: depositing sidewalls covering outer surfaces of the plurality of gate structures and the thin oxide layer on the outer surfaces of the plurality of fin structures;

step 3: removing the sidewalls on top of the plurality of gate structures by etching, and removing sidewalls on second fin structures among the plurality of fin structures by etching;

step 4: removing by etching the first fin structure from each of the second fin structures with the sidewalls removed in step 3, so as to form trenches at where the first fin structure is removed;

step 5: removing by etching the thin oxide layer on sidewalls of the trenches to expand a volume of each of the trenches; and

step 6: forming an epitaxial layer structure at the trenches.

FIG. 6

SOURCE AND DRAIN EPITAXY FORMING METHOD CAPABLE OF IMPROVING PERFORMANCE OF FINFET DEVICE

CROSS-REFERENCES TO RELATED APPLICATIONS

This application claims priority to Chinese patent application No. CN 202010729638.4, filed on Jul. 27, 2020 at CNIPA, and entitled "SOURCE AND DRAIN EPITAXY FORMING METHOD CAPABLE OF IMPROVING PERFORMANCE OF FINFET DEVICE", the disclosure of which is incorporated herein by reference in entirety.

TECHNICAL FIELD

The disclosure relates to the technical field of semiconductors, and in particular to a source and drain epitaxy forming method capable of improving the performance of an FinFET device.

BACKGROUND

From 90 nm note on, the technique applying epitaxial silicon germanium (SiGe) in source and drain is the key factor in improving the performance of a PMOS device. From 14 nm note on, the technology of applying an epitaxial silicon phosphate (SiP) in source and drain is adopted to improve the performance of NMOS. Different epitaxial profiles generate different levels of stresses, which will affect the performance of the devices. In the traditional process, trench etching for epitaxial layers keeps a thick oxide layer remain in trenches, such that the volume of a subsequently grown epitaxial layer is greatly limited.

However, an epitaxial layer with a larger volume is conducive to enhancing the stress level and reducing the resistance, so how to increase the volume of the epitaxial layers is worthy of being discussed.

In view of the above disadvantages in the prior art, this disclosure aims to provide a source and drain epitaxial structure forming method which is capable of improving an FinFET device's performance. The disclosed technique solves the problem that a thick oxide layer remains on sidewalls of trenches after epitaxial layer trenches of an FinFET device are formed in the art, such that the growth of the epitaxial layer becomes limited, impacting the device's performance.

BRIEF SUMMARY

Embodiments of the disclosure provide a method forming a source and drain epitaxy layers of a FinFET device. The method comprises the following steps:

step 1: providing a fin device structure, by:

forming a plurality of fin structures located on a substrate and arranged spaced out from each other in a longitudinal direction; wherein outer surfaces of the plurality of fin structures and the substrate are covered with a thin oxide layer;

forming shallow trench isolation (STI) regions located between adjacent ones of the plurality of fin structures outside the thin oxide layer, wherein upper surfaces of the STI regions are lower than a top of the plurality of fin structures; wherein each of the plurality of fin structures comprises a first fin structure, wherein the first fin structure is higher than an upper surface of the STI regions; and forming a plurality of gate structures on the substrate and arranged in a spaced manner in a transverse direction on the thin oxide layer on the outer surfaces of the plurality of fin structures;

step 2: depositing sidewalls covering outer surfaces of the plurality of gate structures and the thin oxide layer on the outer surfaces of the plurality of fin structures;

step 3: removing the sidewalls on top of the plurality of gate structures by etching, and removing sidewalls on second fin structures among the plurality of fin structures by etching;

step 4: removing by etching the first fin structure from each of the second fin structures with the sidewalls removed in step 3, so as to form trenches at where the first fin structure is removed;

step 5: removing by etching the thin oxide layer on sidewalls of the trenches to expand a volume of each of the trenches; and step 6: forming an epitaxial layer structure at the trenches.

In some cases, the plurality of gate structures in step 1 comprises a polysilicon layer, a hard mask layer located on the polysilicon layer, and an oxide layer located on the hard mask layer.

In some cases, a height of the first fin structure in step 1 ranges from 30 nm to 90 nm.

In some cases, removing by etching the sidewalls on top of the plurality of gate structures in step 3 comprises removing by etching the sidewalls on top of the oxide layer and on a part of the sidewalls below a top of the oxide layer.

In some cases, when the thin oxide layer on the sidewalls of the trenches is removed in step 5, the STI regions on two sides of the first fin structure corresponding to the etched thin oxide layer are also etched to form STI trenches.

In some cases, etching the thin oxide layer in step 5 is anisotropic etching.

In some cases, a longitudinal thickness of the thin oxide layer after step 5 ranges from 3 nm to 10 nm.

In some cases, a transverse thickness of the thin oxide layer after step 5 is 2 nm.

In some cases, the epitaxial layer structure formed in step 6 is either SiGe or SiP.

As described above, the source and drain epitaxy forming method capable of improving the performance of the FinFET device provided by the disclosure has the following beneficial effects: in the manufacturing process of the FinFET device, after epitaxial layer trenches are formed, a process of removing the oxide on the sidewalls of the trenches by etching is added to increase the volume of the subsequently grown epitaxial layer, the increase of the volume of the epitaxial layer is conducive to increasing the stress and reducing the source and drain resistance, thus improving the performance of the device. The method of the added process of etching the oxide adopted in the disclosure is simple and effective, without damaging other parts. The performance of the FinFET device can be effectively improved, and the production cost can be reduced.

BRIEF DESCRIPTION OF THE DRAWINGS

FIG. 6 illustrates a flowchart of a source and drain epitaxial layer forming method which is capable of improving the performance of the FinFET device according to the disclosure.

DETAILED DESCRIPTION OF THE DISCLOSURE

The embodiments of the disclosure will be described below through specific examples, and those skilled in the art can easily understand other advantages and effects of the disclosure from the content disclosed in the description. The disclosure may also be implemented or applied through other different specific embodiments, and various details in the description may also be modified or changed based on different viewpoints and applications without departing from the spirit of the disclosure.

It should be noted that the drawings provided in the embodiments are only used for schematically describing the basic concept of the disclosure, thus only illustrate components related to the disclosure, and are not drawn according to the number, shape and size of the components in the actual implementation. The form, number and scale of the components in the actual implementation may be freely changed and the layout of the components may be more complex.

Embodiment 1

According to some embodiments of the disclosure, a method provides a source and drain epitaxial layer forming method which is capable of improving the performance of an FinFET device. Referring to FIG. 6, which illustrates a flowchart of a source and drain epitaxial layer forming method which can improve the performance of the FinFET device. The source and drain epitaxial layer forming method as mentioned above includes the following steps:

In step 1, a fin device structure is provided. The fin device structure includes a plurality of fin structures located on a substrate and arranged in parallel and spaced out from each other along a longitudinal direction, wherein the outer surfaces of the fin structures and the substrate are covered with a thin oxide layer; STI (shallow trench isolation) regions are located outside the thin oxide layer and fill between adjacent fin structures, wherein the upper surfaces of the STI regions are lower than the top of the fin structures. The first fin structure is the portion in each fin structure which is above the upper surfaces of the STI regions. A number of gate structures are formed on the thin oxide layer on the substrate and they are arranged in parallel spaced out from each other along the transverse direction on the outer surfaces of the fin structures, as mentioned above, fins are arranged spaced out in the longitudinal direction. Further, in step 1 according to the disclosure, the gate structures include a polysilicon layer, a hard mask layer located on the polysilicon layer, and an oxide layer located on the hard mask layer. Further, the height of the first fin structure made in step 1 has a range from 30 nm to 90 nm.

Figure 1:
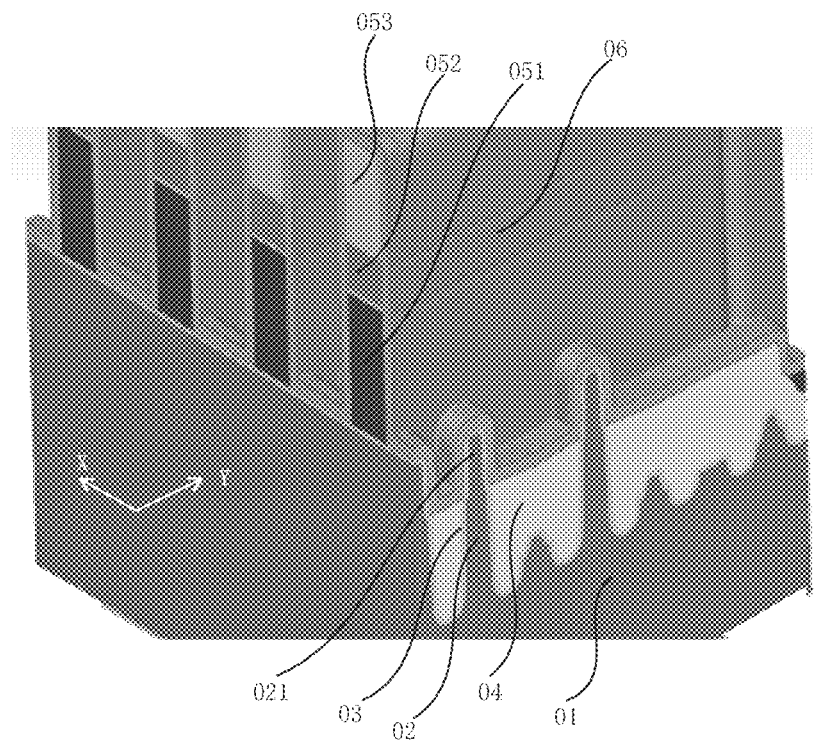
FIG. 1 illustrates a schematic three-dimensional cross-sectional view of a fin device structure according to the disclosure.

Referring to FIG. 1, which illustrates a schematic three-dimensional cross-sectional view of a fin device structure according to some embodiments of the disclosure. The fin device structure includes a plurality of fin structures 02 arranged spaced out from each other along the longitudinal direction on the substrate 01, herein the substrate 01 is made of a material such as silicon, and the fin structures 02 have the protrusion shapes obtained by etching the substrate 01. In the disclosure, the plurality of fin structures 02 are arranged spaced out from each other along the longitudinal direction, which is defined as the Y direction in a reference coordinate system (X-Y) of the three-dimensional structure in FIG. 1, i.e., the direction in which the plurality of fin structures 02 are arranged, wherein each fin structure is located extending in the transverse direction (fin is the X direction is a strip-shaped structure in FIG. 1); the outer surface of each of the fin structures 02 and the substrate 01 are covered with a thin oxide layer 03, i.e., a thin oxide layer 03 is deposited on the outer surface of each of the strip shaped fin structures in the transverse direction (X direction) and arranged as spaced out structures in the longitudinal direction (Y direction). In addition, the thin oxide layer 03 is also deposited on the upper surfaces of the substrate 01 between the fin structures 02.

The fin device structure further includes STI regions 04 located outside the thin oxide layer 03 and filled between adjacent fin structures. Referring to FIG. 1, the STI regions are shallow trench isolation regions and fill the space between the fin structures and the space on the outer surfaces of the thin oxide layer; the upper surfaces of the STI regions 04 are lower than the tops of the fin structures 02, and the part of each fin structure higher than the upper surfaces of the STI regions 04 is a first fin structure 021. Referring to FIG. 1, the upper surface of each STI region filled between the fin structures divide the height of each fin structure into two parts. The height of one part is greater than the height of the STI region, and this part is a first fin structure 021. Further, in the disclosure, the heights of the first fin structures 02 provided in step 1 range from 30 to 90 nm.

Each of the fin device structures 02 further includes a plurality of gate structures formed on the substrate 01 and arranged spaced apart in a transverse direction (X-direction) on the thin oxide layer 03 on the outer surfaces of the plurality of fin structures 02 arranged in the spaced manner in the longitudinal direction. Referring to FIG. 1, the arrangement direction of the gate structures is in X direction. Further, in the disclosure, the gate structures in step 1 include a polysilicon layer 051, a hard mask layer (HM) 052 located on the polysilicon layer 051, and an oxide layer 053 located on the hard mask layer 052.

In step 2, sidewalls are deposited over the outer surfaces of the plurality of gate structures and the thin oxide layer on the outer surfaces of the plurality of fin structures. Continue to referring to FIG. 1, the sidewalls 06 not only cover the outer surfaces of the gate structures 051, but also cover the thin oxide layer 03 on the fin structures 02.

Figure 2:
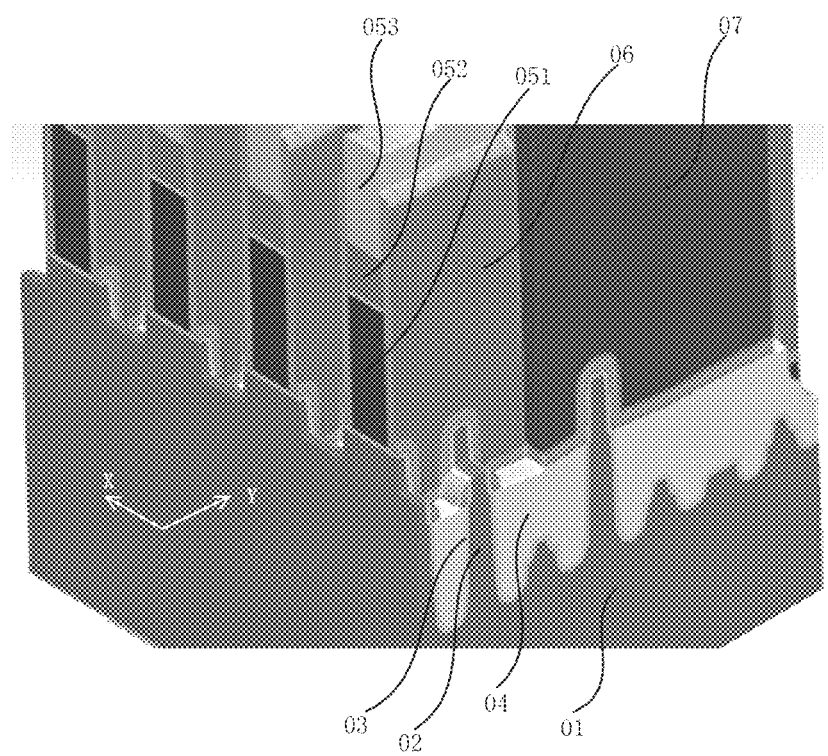
FIG. 2 illustrates a schematic three-dimensional cross-sectional view after sidewalls on top of gate structures are removed by etching according to the disclosure.

In step 3, the sidewalls on top of the gate structures and the sidewalls on some fin structures are removed by etching. As in the disclosure, the step of removing the sidewalls by etching from the top of the gate structures 051 in step 3 includes etching the sidewalls on top of the oxide layer 053 and on part of the sidewalls below the top of the oxide layer 053. Referring to FIG. 2, which illustrates a schematic three-dimensional cross sectional view after the sidewalls on top of the gate structures 051 are etched off in the disclosure. The sidewalls 06 on top of the gate structures 051 are etched such that the oxide layer 053 on top of the gate structures 051 is exposed, and the height of the sidewalls on the sidewalls of the gate structures remains on the sidewalls of the oxide layer 053, that is, the sidewalls 06 on the gate structures 051 are etched to expose the top and a part of the sidewalls of the oxide layer 053. At the same time of etching the sidewalls in step 3, the sidewalls over a number of the fin structures 02 are also etched, that is, the sidewalls of some of the fin structures 02 are removed by etching, and photoresist 07 protects the sidewalls of other fin structures from being etched.

Figure 3:
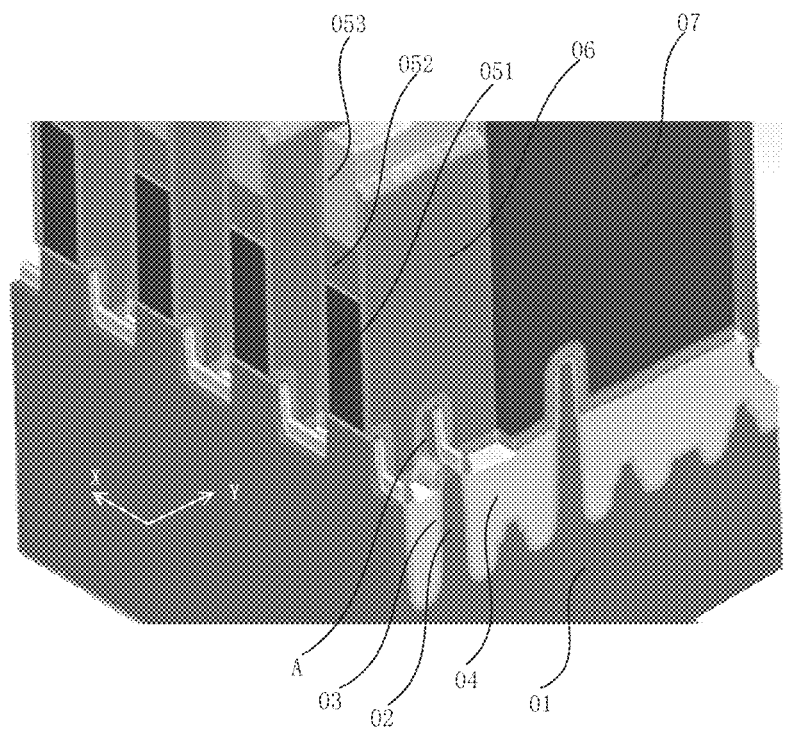
FIG. 3 illustrates a schematic three-dimensional cross-sectional view after the first fin structures are removed by etching according to the disclosure.

In step 4, remove by etching the first fin structure in each of the fin structures which have the sidewalls removed in step 3, so as to form trenches at the positions where the first fin structures are removed. Referring to FIG. 3, which illustrates a schematic three-dimensional cross sectional view after the first fin structures are removed by etching according to the disclosure. Since the fin structures are made of silicon material in the present embodiment, after the sidewalls on the first fin structures are removed, the first fin structures having the silicon material are exposed. The exposed silicon is etched in step 4. As a result, the areas removed become trenches A in FIG. 3.

Figure 4:
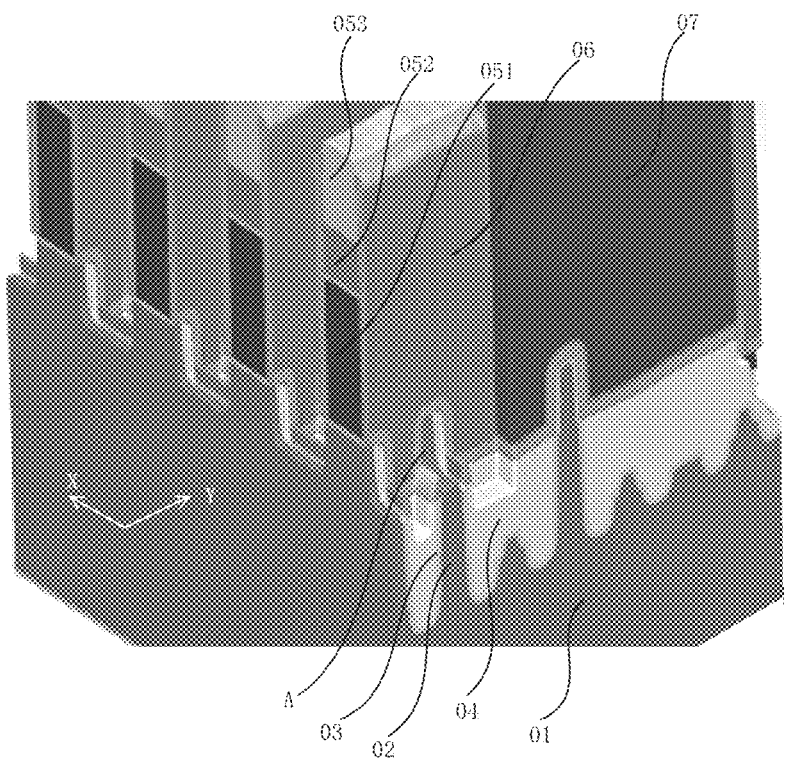
FIG. 4 illustrates a schematic three-dimensional cross-sectional view after removing a thin oxide layer on sidewalls of the trenches.

In step 5, the thin oxide layer on the sidewalls of the trenches is etched to be removed to expand the volume of the trenches. Referring to FIG. 4, which illustrates a schematic three-dimensional cross sectional view after the thin oxide layer 03 on the sidewalls of the trenches is removed. Further, in the disclosure, when the thin oxide layer 03 on the sidewalls of the trenches is removed by etching in step 5, the regions on the two sides of the first fin structures corresponding to the etched thin oxide layer are also etched to form STI trenches. The first fin structures of those fin structures which are etched to form trenches and the thin oxide layer 03 is on the sidewalls of the first fin structures, thus the thin oxide layer 03 also exists on the sidewalls of the formed trenches. In step 5, the thin oxide layer 03 on the sidewalls of the formed trenches A is removed by etching, and the volume of each of the trenches is expanded after this removal, so as to facilitate the subsequent growth of the epitaxial layer.

A method for etching the thin oxide layer 03 in step 5 is anisotropic etching. Further, in the disclosure, the longitudinal (Y) thickness of the thin oxide layer 03 removed in step 5 on the sidewalls of the trenches A ranges 3 to 10 nm, that is, the etched thickness of the thin oxide layer 03 in the Y direction in FIG. 4 ranges from 3 to 10 nm. Since the etching method is anisotropic, the transverse (X-direction) depth of the thin oxide layer 03 which is etched at the same time as on the sidewalls of the trenches in step 5 is 2 nm, so as to prevent the oxide layer 05 from having an excessive loss such that a bridge developed in the epitaxial layer can short towards the gate direction.

Figure 5:
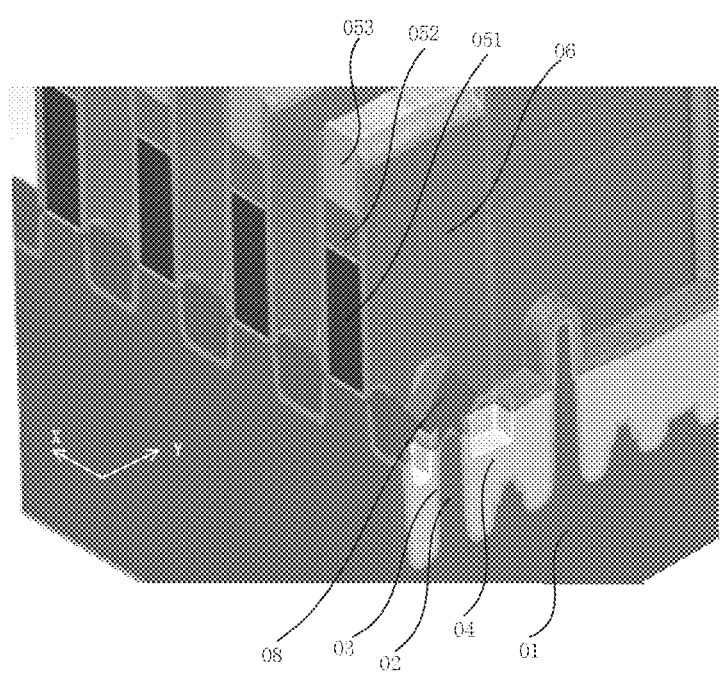
FIG. 5 illustrates a schematic three-dimensional cross-sectional view after an epitaxial layer is formed according to the disclosure.

In step 6, an epitaxial layer structure is formed at the locations of the number of trenches having etched sidewalls. Referring to FIG. 5, which illustrates a schematic three-dimensional cross sectional view after the epitaxial layer formed in the disclosure. Further, in the disclosure, the epitaxial layer structure 08 formed at the locations of the selected trenches A above in step 6 is silicon germanium (SiGe) or silicon phosphate (SiP).

Embodiment 2

Embodiment 2 of the disclosure includes repeating step 1 and step 2 in embodiment 1. Their difference lies in the step 3, in which the fin structures are coated with photoresist after epitaxial growth in embodiment 1, those fin structures having the non-removed sidewalls after step 3 in embodiment 1 are not coated with photoresist thus are exposed, and then the sidewalls of the exposed fin structures are removed by etching. Then, the step 4 to step 6 in embodiment 1 are repeated. The epitaxial layer grown in step 6 is different from the epitaxial layer in embodiment 1, in which the epitaxial layer is either SiGe or SiP. Therefore, in the embodiment 2, an epitaxial layer including both SiGe and SiP in the same FinFET device structure is obtained.

To sum up, in the manufacturing process of the FinFET device, after epitaxial layer trenches are formed, a process of removing by etching the oxide on the sidewalls of the trenches is introduced to increase the volume of the subsequently grown epitaxial layer The increase of the volume of the epitaxial layer is conducive to increasing the stress and reducing the source and drain resistance, thus improving the performance of the device. The method of the added process of etching the oxide adopted in the disclosure is simple and effective, other parts are not damaged, the performance of the FinFET device can be effectively improved, and the production cost is reduced. Therefore, the disclosure effectively overcomes various disadvantages in the prior arts and thus has a great industrial utilization value.

The above embodiments are used for describing the principle and effect of the disclosure only, instead of limiting the disclosure. Those skilled in the art may modify or change the above embodiments without going beyond the spirit and scope of the disclosure. Therefore, all equivalent modifications or changes made by those skilled in the art without departing from the spirit and technical concept disclosed in the disclosure shall still be covered by the claims of the disclosure.

What is claimed is:

1. A method of forming a source and a drain epitaxy of an FinFET device, comprising:
   step 1: providing a fin device structure, including:
      forming a plurality of fin structures located on a top surface of a substrate and arranged in a spaced manner in a longitudinal direction; wherein outer surfaces of the plurality of fin structures and the substrate are covered with a thin oxide layer, wherein each of the plurality of fin structures comprises a first fin structure and a second fin structure, and wherein the first fin structure is arranged to be above the second fin structure;
      forming shallow trench isolation (STI) regions located between adjacent ones of the plurality of fin structures, wherein the shallow trench isolation regions are configured to be outside the thin oxide layer, wherein the first fin structure is arranged to be above an upper surface of one of the STI regions and the second fin structure is arranged to be below the upper surface of the STI regions; and
      forming a plurality of gate structures on the substrate, wherein the plurality of gate structures is arranged spaced out from each other in a transverse direction on the thin oxide layer on the outer surfaces of the plurality of fin structures, wherein the transverse direction and the longitudinal direction are perpendicular to each other in a plane parallel to the top surface of the substrate;
   step 2: depositing sidewalls covering outer surfaces of the plurality of gate structures and the thin oxide layer on the outer surfaces of the plurality of fin structures;
   step 3: removing the sidewalls from tops of the plurality of gate structures by etching, and removing sidewalls from each of the second fin structures by etching;

step 4: removing by etching the first fin structure without etching the second fin structure from each of the plurality of fin structures, so as to form trenches at where the first fin structure is removed;

step 5: removing by etching the thin oxide layer on sidewalls of the trenches to expand a volume of each of the trenches; and step 6: forming an epitaxial layer structure at the trenches.

2. The method of forming the source and the drain epitaxy of the FinFET device according to claim 1, wherein the plurality of gate structures in step 1 comprises a polysilicon layer, a hard mask layer located on the polysilicon layer, and an oxide layer located on the hard mask layer.

3. The method of forming the source and the drain epitaxy of the FinFET device according to claim 1, wherein a height of the first fin structure in step 1 ranges from 30 nm to 90 nm.

4. The method of forming the source and the drain epitaxy of the FinFET device according to claim 2, wherein removing by etching the sidewalls on the top of the plurality of gate structures in step 3 comprises removing by etching the sidewalls on top of the oxide layer and on a part of the sidewalls below a top of the oxide layer.

5. The method of forming the source and the drain epitaxy of the FinFET device according to claim 1, wherein when the thin oxide layer on the sidewalls of the trenches is removed in step 5, the STI regions on two sides of the first fin structure corresponding to the etched thin oxide layer are also etched to form STI trenches.

6. The method of forming the source and the drain epitaxy of the FinFET device according to claim 1, wherein etching the thin oxide layer in step 5 is anisotropic etching.

7. The method of forming the source and the drain epitaxy of the FinFET device according to claim 1, wherein a longitudinal thickness of the thin oxide layer after step 5 ranges from 3 nm to 10 nm.

8. The method of forming the source and the drain epitaxy of the FinFET device according to claim 7, wherein a transverse thickness of the thin oxide layer after step 5 is 2 nm.

9. The method of forming the source and the drain epitaxy of the FinFET device according to claim 1, wherein the epitaxial layer structure formed in step 6 is either SiGe or SiP.

* * * * *